(12) United States Patent
Hayami et al.

(10) Patent No.: US 7,008,275 B2
(45) Date of Patent: Mar. 7, 2006

(54) ELECTRICAL JOINT FORMING MEMBER AND PLASMA PROCESSING APPARATUS

(75) Inventors: Toshihiro Hayami, Nirasaki (JP); Naoyuki Umehara, Nirasaki (JP); Tsuyoshi Hasegawa, Suita (JP)

(73) Assignees: Tokyo Electron Limited, Tokyo-To (JP); Neomax Materials Co., Ltd., Osaka-Fu (JP)

( * ) Notice: Subject to any disclaimer, the term of this patent is extended or adjusted under 35 U.S.C. 154(b) by 0 days.

(21) Appl. No.: 10/951,884

(22) Filed: Sep. 29, 2004

(65) Prior Publication Data

US 2005/0070174 A1 Mar. 31, 2005

(30) Foreign Application Priority Data

Sep. 30, 2003 (JP) .............................. 2003-341462

(51) Int. Cl.
*H01R 13/02* (2006.01)
(52) U.S. Cl. .................. 439/886; 439/92; 439/816; 439/887; 439/66; 174/35 C; 174/35 GC
(58) Field of Classification Search ............... 439/92, 439/816, 817, 840, 884, 886, 887, 89–91, 439/66; 174/35 R, 35 C, 35 GC
See application file for complete search history.

(56) References Cited

U.S. PATENT DOCUMENTS

| 5,256,993 A | * | 10/1993 | Walter et al. | ............... 335/216 |
| 5,840,953 A | * | 11/1998 | Potts | ........................... 556/483 |
| 5,845,581 A | * | 12/1998 | Svensson | .................... 104/120 |
| 5,992,468 A | * | 11/1999 | Dwiggins | ................... 138/108 |
| 6,182,576 B1 | * | 2/2001 | Svensson | .................... 104/120 |
| 6,396,377 B1 | * | 5/2002 | Ying | ........................... 335/300 |
| 6,450,103 B1 | * | 9/2002 | Svensson | .................... 104/120 |

FOREIGN PATENT DOCUMENTS

| JP | 8-120469 | 5/1996 |
| WO | WO 00/75972 | 12/2000 |

* cited by examiner

*Primary Examiner*—Gary Paumen
(74) *Attorney, Agent, or Firm*—Smith, Gambrell & Russell, LLP

(57) ABSTRACT

An electrical joint forming member is held between adjacent conductive members included in a semiconductor device fabricating apparatus to reduce electrical resistance between those conductive members. The electrical joint forming member includes an elastic member made of a titanium sheet (75 μm thick, 2 mm wide) and having a surface covered with an aluminum layer (7 μm thick), the aluminum layer being formed by joining an aluminum sheet to the surface of the titanium sheet by cold-roll bonding.

5 Claims, 11 Drawing Sheets

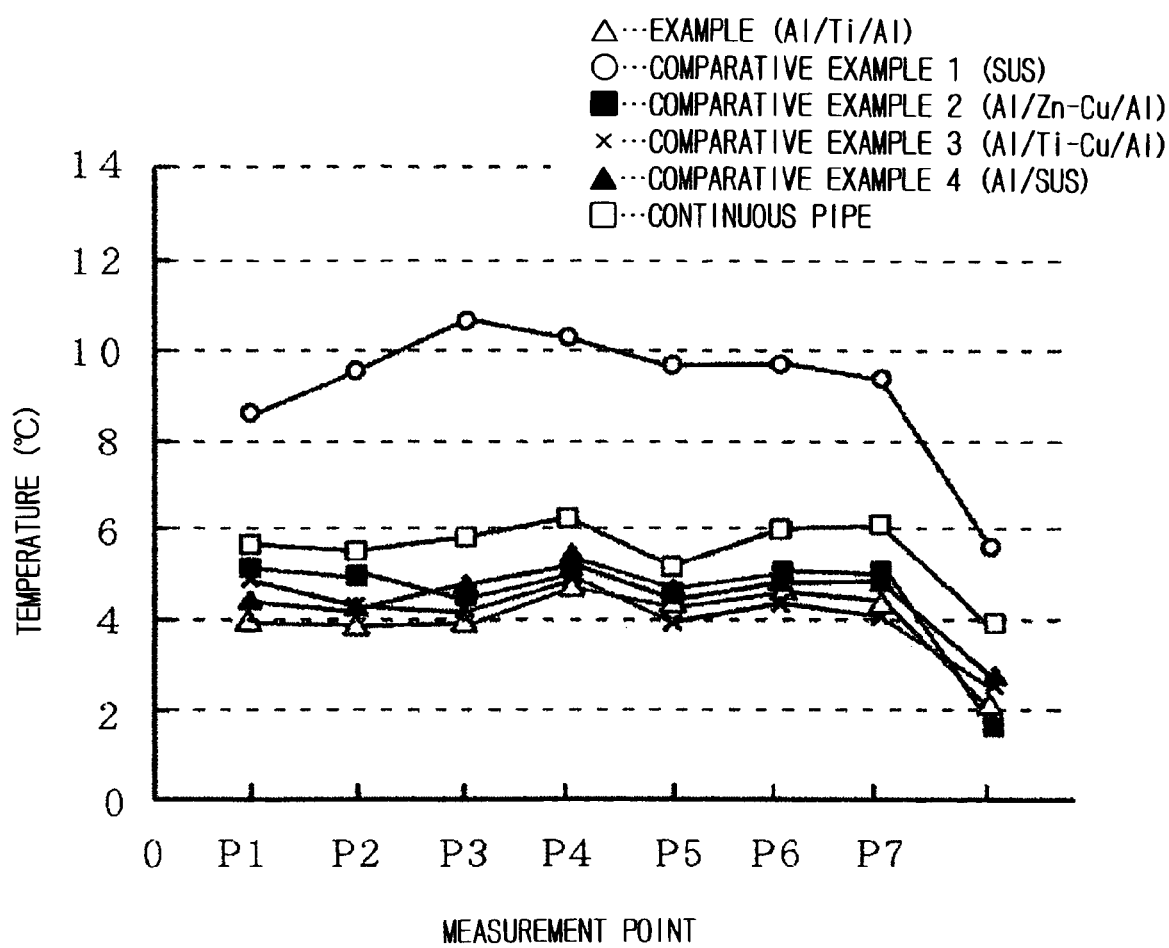
F I G. 14

ELECTRICAL JOINT FORMING MEMBER AND PLASMA PROCESSING APPARATUS

BACKGROUND OF THE INVENTION

1. Field of the Invention

The present invention relates to an electrical joint forming member to be held between different conductive members included in a processing apparatus, and a plasma processing apparatus employing the electrical joint forming member.

2. Description of the Related Art

A semiconductor device fabricating procedure includes a process using a plasma produced by discharging a process gas for etching or film deposition. A plasma processing apparatus that carries out such a semiconductor device fabricating procedure includes a vacuum vessel and peripheral components formed by assembling a plurality of members to facilitate assembling and disassembling. Some joints of the members have a hermetic sealing function or a high-frequency current transmitting function. For example, the bear surfaces of aluminum members are brought into electrical contact with each other, and the aluminum members are fastened together with a plurality of bolts to ensure the transmission of high-frequency current through the members. A conductive cushioning member is placed in some joint to improve the electrical contact of the joint.

Referring to FIG. 15 showing an etching apparatus, which is a plasma processing apparatus, in a schematic sectional view, a support table serving also as a lower electrode 12 is mounted on the bottom wall of an aluminum vacuum vessel 1 through an insulating member 11. A shower head, through which a process gas is supplied into the vacuum vessel 1, serving also as an upper electrode 13 forms the top wall of the vacuum vessel 1. The inner surface of the side wall of the vacuum vessel 1 is covered with a cylindrical deposition shield 14 to prevent the deposition of matters on the inner surface of the side wall. The lower electrode 12 is connected to a high-frequency power source 15, and the vacuum vessel 1 is grounded. A high-frequency current flows from the upper electrode 13 through a surface part of the deposition shield 14 to the ground.

The conductive members including the deposition shield 14 and exposed to the atmosphere in the vacuum vessel 1 are required to be at the same potential (ground potential) to produce a uniform plasma. Therefore, the contact surfaces of the vacuum vessel 1 and the deposition shield 14 are pressed together with bolts, not shown, with cushioning members 16 held between the contact surfaces. The cushioning members 16 are, for example, stainless steel spiral seals such as disclosed in WO 00/75972 (pp. 11–12, FIGS. 8A and 8B).

As obvious from the results of experiments, which will be explained later, a contact load acting between contact surfaces of the spiral seal and the vacuum vessel is as low as about 1/5 of a contact load acting between contact surfaces of the deposition shield and the vacuum vessel when the deposition shield and the vacuum vessel are fastened together with bolts while the spiral seal held therebetween. Generally, the vacuum vessel is formed of aluminum. Measured contact resistance between an aluminum member and a stainless steel spiral seal determined through tests was considerably large when a contact load that was expected to act on the contact surfaces between the vacuum vessel and the stainless steel spiral fastened together with bolts acted on the contact surfaces between the aluminum member and a stainless steel spiral.

Recently, the frequency of high-frequency power used by the plasma processing apparatus is progressively increasing. Since the high-frequency current flows through a shallow surface part of a conductive member, the effect of the state of contact between conductive members on the surface potential of the conductive members is significant. Consequently, the effect of a process for processing a semiconductor wafer (hereinafter, referred to simply as "wafer"), such as an etching process, is sensitive to the state of contact. For example, in the plasma processing apparatus shown in FIG. 15, it is ideal that the entire surface of the deposition shield 14 is at the ground potential. However, if contact resistance between the conductive members is large, the potential of the surface of the deposition shield 14 becomes irregular and, consequently, a uniform plasma cannot be produced, the energy efficiency of high-frequency power decreases and etch rate decreases. As the minuteness of patterns of semiconductor integrated circuits increases progressively, the condition of a plasma process becomes more and more sensitive to the magnitude and distribution of the surface potential of conductive members. It is possible that the large contact resistance of a joint provided with a stainless steel spiral seal reduces yield.

Moreover, a high torque is applied to the bolts for fastening the members together. Therefore, the conductive members deform by the repetition of assembly and disassembly for maintenance and long period of use, and face pressure acting on the conductive members changes. Since a processing apparatus for processing large-diameter wafers includes large component parts which thus deform largely, causing in-plane uniformity of plasma-processed wafers and etch rate to change. Increase in the number of bolts fastening together members with a spiral seal held between the members to increase face pressure acting on the members will adversely affect the maintenance of the processing system.

A cushioning member disclosed in JP8-120469A (Paragraph 0016) is formed by covering the surface of a rubber tube with a stainless steel mesh or a copper mesh. The cushioning member provided with the stainless steel mesh also cannot ensure satisfactory electrical contact. Although the cushioning member provided with the copper mesh has a low contact resistance because copper has a small specific resistance, the copper mesh can cause the metal-contamination of semiconductor integrated circuits and hence the cushioning member provided with the copper mesh cannot be practically applied to semiconductor device fabricating apparatuses.

SUMMARY OF THE INVENTION

The present invention has been made in view of such circumstances and it is a first object of the present invention to provide an electrical joint forming member capable of reducing electrical resistance between conductive members included in a processing apparatus, not having any possibility of causing the metal-contamination of semiconductor devices, and resistant to deformation due to repetitive use.

A second object of the present invention is to provide a plasma processing apparatus using high-frequency power for carrying out a plasma process, employing the electrical joint forming member of the present invention to make uniform the potential distribution on the surface of a conductive member exposed to a plasma, and capable of achieving a satisfactory plasma process.

In order to achieve the objectives, the present invention provides an electrical joint forming member to be held between adjacent conductive members included in a processing apparatus to reduce electrical resistance between those conductive members. The electrical joint forming member includes an elastic member made of a titanium sheet and having a surface covered with an aluminum layer, the aluminum layer being formed by joining an aluminum sheet to the surface of the titanium sheet by cold-roll bonding.

The elastic member is, for example, a spiral. The conductive members electrically connected by the electrical joint forming member are those through which high-frequency current flows. The aluminum layer has a thickness of, for example, 50 µm or below. Since the aluminum layer is not elastic, it is preferable, from the viewpoint of fabrication, that the thickness of the aluminum layer is 15 µm or below. The aluminum layer is arranged on a surface, facing the conductive member, of the titanium elastic member. The aluminum layer may be arranged on both or only one of the surfaces of the elastic member.

The present invention also provides a plasma processing apparatus for processing the surface of a substrate by a predetermined process using a plasma produced by discharging a process gas by high-frequency power. The processing apparatus includes: electrically conductive members assembled to constitute a part of said plasma processing apparatus; and the electrical joint forming member, having aforementioned structure, held between adjacent conductive members.

The substrate is, for example, a semiconductor wafer and a glass substrate for a liquid crystal display.

Since the electrical joint forming member is made by laminating an aluminum sheet, which has a small specific resistance but is inelastic, with a titanium sheet, which is elastic, the electrical joint forming member, as a whole, has a small specific resistance and is elastic. Thus the electrical joint forming member reduces electrical resistance between the conductive members. In addition, the aluminum surface layer does not cause the metal-contamination of semiconductor devices. Consequently, the semiconductor device fabricating apparatus is able to achieve the process satisfactorily and power loss can be reduced. The electrical joint forming member formed in a titanium-aluminum laminated structure having the shape of a spiral is resistant to deformation due to repetitive use. Thus electrical resistance of the electrical joint forming member does not change or changes slightly after the repetition of maintenance and hence the semiconductor device fabricating apparatus has a stable electric characteristic.

The plasma processing apparatus according to the present invention reduces the electric resistance between the conductive members by employing the electrical joint forming member to make the distribution of potential on the surfaces of the conductive members exposed to a space in which a plasma is produced, so that a highly uniform plasma can be produced and the substrate can be satisfactorily processed.

BRIEF DESCRIPTION OF THE DRAWINGS

FIG. 14 is a graph showing temperatures of conductive parts measured by the measuring instrument shown in FIG. 11 when high-frequency power is supplied to the conductive parts.

DESCRIPTION OF THE PREFERRED EMBODIMENTS

Figure 1A:
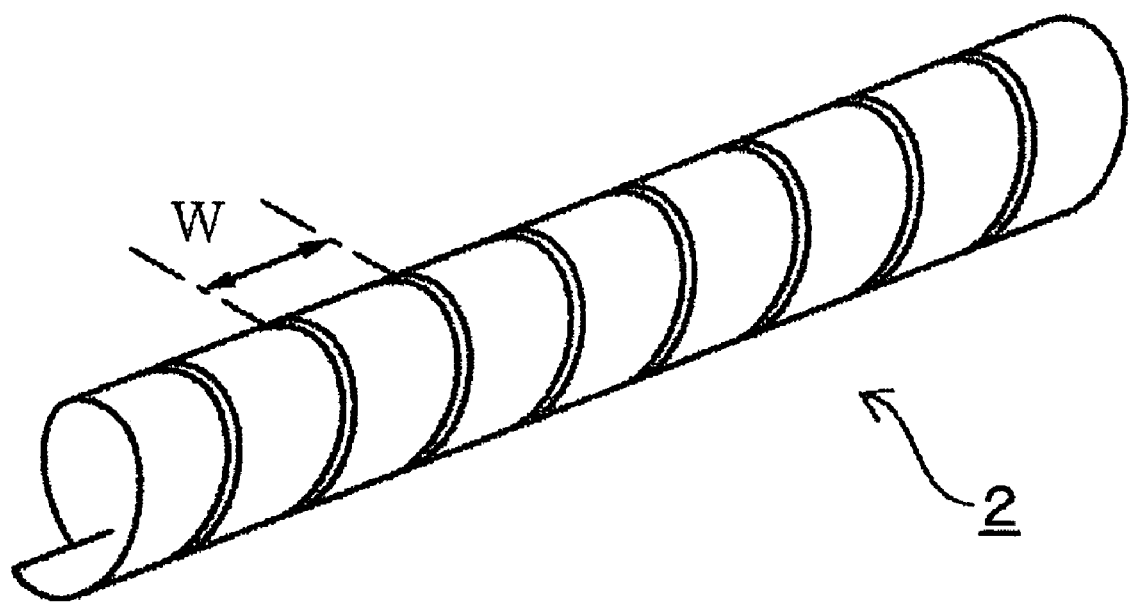
FIGS. 1A and 1B are a perspective view and a cross-sectional view, respectively, of an electrical joint forming member embodying the present invention.

An electrical joint forming member and a plasma processing apparatus, namely, a processing apparatus, embodying the present invention will be described with reference to the accompanying drawings. FIG. 1A schematically shows an electrical joint forming member 2 embodying the present invention. The electrical joint forming member 2 includes: a spiral 21, namely, an elastic member, formed by winding a titanium strip (i.e., elongated sheet) having a thickness of 75 µm and a width W of about 2 mm, for example; and aluminum layers 22 each having a thickness of 7 µm, for example, and arranged on the front and back surfaces of the spiral 21 by cold pressure welding.

Figure 1B:
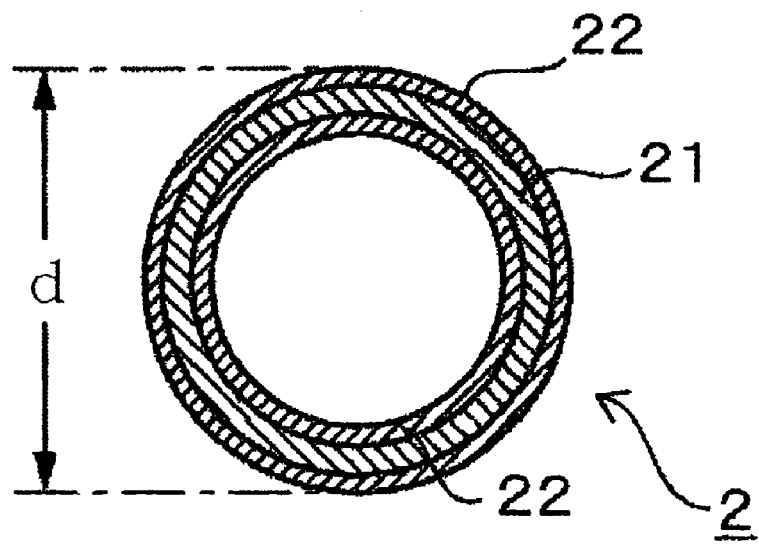

More concretely, the electrical joint forming member 2 is fabricated by the following operations. Aluminum coils each formed by coiling an aluminum strip are arranged above and below a titanium coil formed by coiling a titanium strip. These coils are unwound to superpose the strips so that the aluminum strips overlies and underlies the titanium strip, respectively. The superposed strips are passed between rolls at a predetermined compressing ratio for cold-roll bonding so that the strips are cold-roll bonded. The cold-bonded strips are subjected to a diffusion annealing process at a predetermined temperature in a vacuum or inert gas atmosphere, and then are optionally subjected to a cold rolling process. Thereby, a composite strip (i.e., a three-layer clad strip) consisting of the titanium strip and the aluminum layers 22 respectively coating the surfaces of the titanium strip is obtained. The composite strip is coiled to form the spiral electrical joint forming member 2 having an outside diameter d (see FIG. 1B) of about 2.4 mm as shown in FIG. 1.

Figure 2:
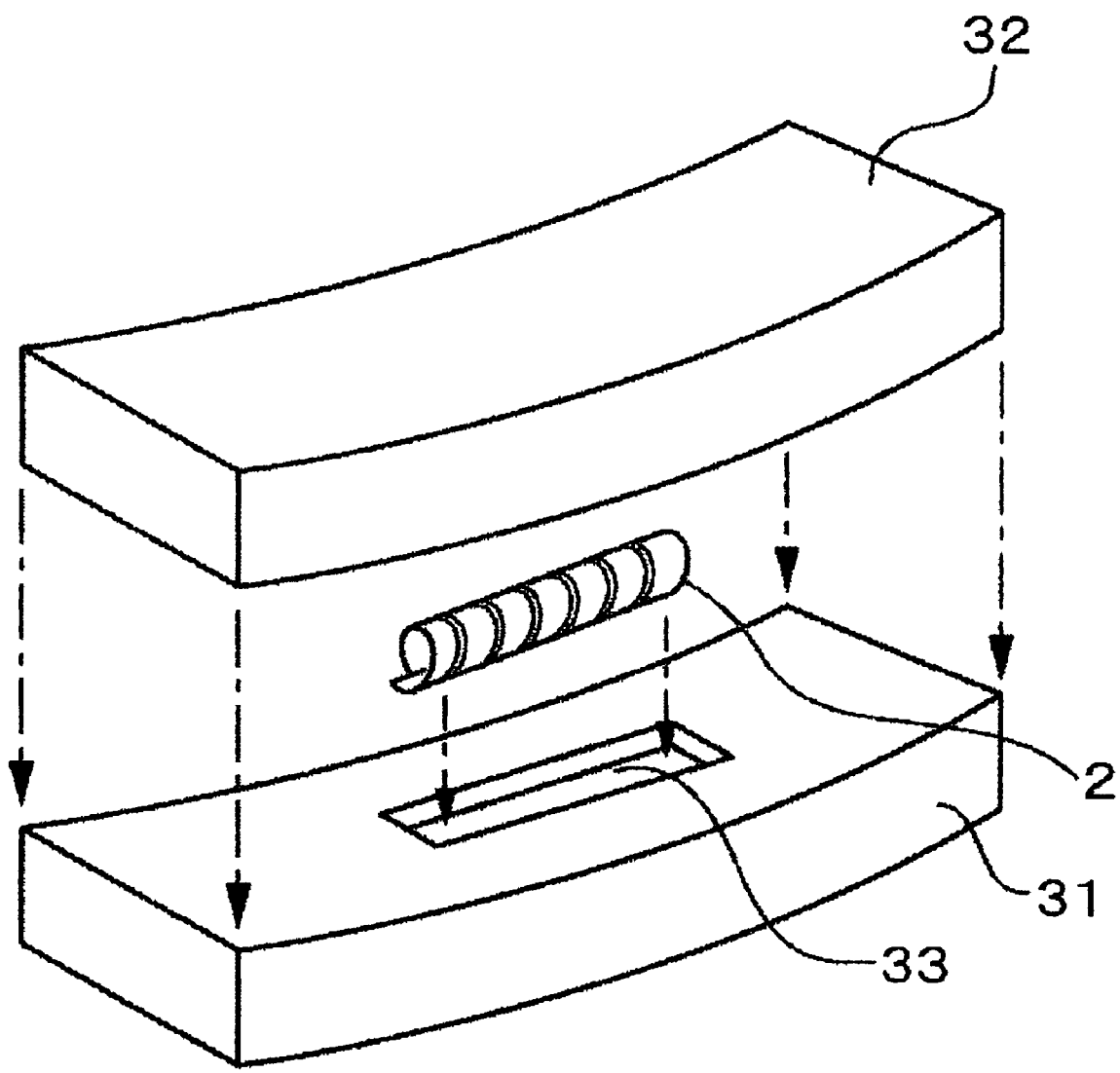
FIG. 2 is an exploded perspective view of assistance in explaining a mode of use of the electrical joint forming member shown in FIG. 1A.
Figure 3:
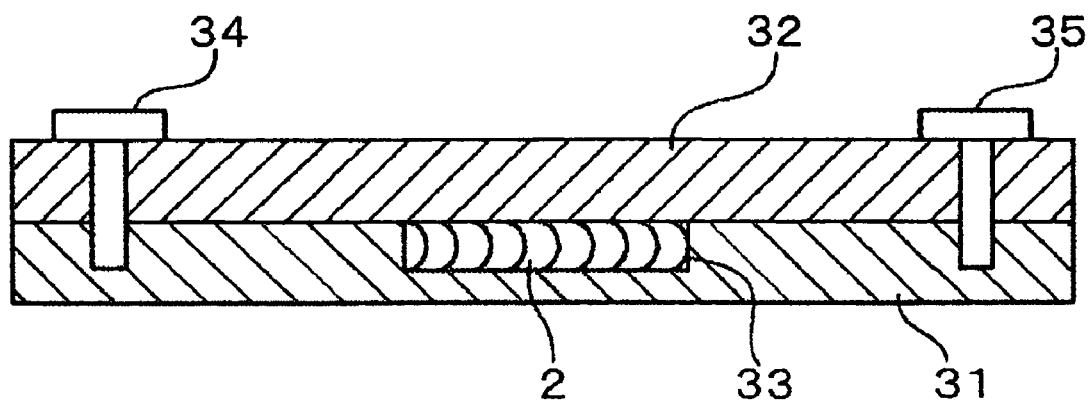
FIG. 3 is a sectional view of assistance in explaining another mode of use of the electrical joint forming member shown in FIG. 1A.

The electrical joint forming member 2 thus fabricated is laid in a groove 33 formed in one of conductive members 31 and 32, the conductive member 31 in FIGS. 2 and 3, and the conductive members 31 and 32 are then fastened together with bolts 34 and 35 as shown in FIG. 3 so that the conductive members 31 and 32 are pressed to each other. The depth of the groove 33 is smaller than the outside diameter d of the electrical joint forming member 2. When the conductive members 31 and 32 are fastened together with the bolts 34 and 35 so that their surfaces contact, the electrical joint forming member 2 is squeezed by a predetermined squeeze, which is the difference between the outside diameter d of the electrical joint forming member 2 before squeezing and that after squeezing. Contact resistance between the conductive member 31 (32) and the electrical joint forming member 2 is dependent on the squeeze.

As described above, the electrical joint forming member 2 consists of a spiral 21 of elastic (i.e., suitable for use as a spring) titanium and layers 22 of aluminum, which has a small specific resistance but is inelastic (i.e., not suitable for use as a spring), arranged on the outer and the inner surface of the titanium spiral 21. Accordingly, the electrical joint forming member 2, as a whole, is elastic and achieves a small contact resistance between the electrical joint forming member 2 and the conductive member 31 (32). As obvious from the results of experiments, which will be explained later, a contact resistance between an aluminum conductive member and the electrical joint forming member 2 consisting of titanium spiral 21 with aluminum layers 22 is substantially equal to that between the aluminum conductive member and a conventional electrical joint forming member consisting of stainless steel spiral, when the contact load (compressing load) acting on the contact surfaces of the aluminum conductive member the electrical joint forming member of the former is 1/10 or less of the latter.

Thus, electric resistance between the conductive members 31 and 32 can be reduced due to the provision of the electrical joint forming member 2 according to the present invention between the members 31 and 32. In the event that the conductive members 31 and 32 are component parts of a plasma processing apparatus through the surface area of which a high-frequency current flows, potential is distributed uniformly over the surfaces of the conductive members 31 and 32, and consequently, a uniform plasma can be produced and a substrate can be processed by a plasma process, such as an etching process, in a satisfactory in-plane uniformity. Since the electric resistance is small, high-frequency power loss can be limited to a small extent, high-frequency power can be efficiently used and, for example, the reduction of etch rate can be suppressed. Since a high contact load acting on the contact surfaces of the electrical joint forming member 2 and the conductive members 31 and 32 is not necessary, the bolts for joining the conductive members may be fastened by a low torque. Accordingly, the deformation of parts can be reduced, and the change of the ability of the processing apparatus with time causing processing condition to change thus can be suppressed, and hence the processing apparatus is able to carry out the process stably for a long period of time. Since the parts of the processing apparatus are not subject to deformation even if the processing apparatus is operated repeatedly, the processing apparatus is excellent in durability. Since the electric resistance between the conductive members remains substantially unchanged regardless of the repetition of maintenance (assembling and disassembling), the ability of the processing apparatus, such as a plasma processing apparatus, is not changed by maintenance. The reliability of the contact resistance reducing function of the electrical joint forming member is high regardless of whether or not the conductive members are disassembled.

Figure 4:
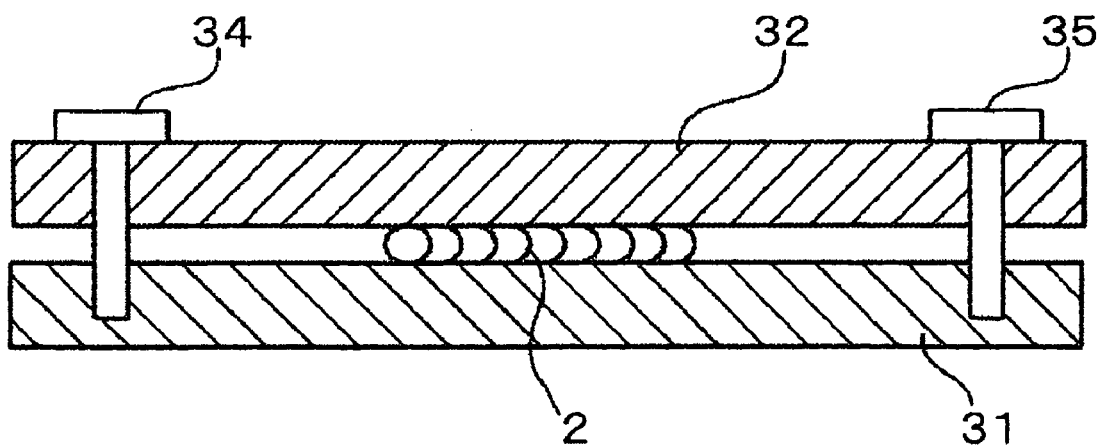
FIG. 4 is a sectional view of assistance in explaining a third mode of use of the electrical joint forming member shown in FIG. 1A.

The electrical joint forming member 2 does not need necessarily to be placed in the groove 33 to place the same between the conductive members 31 and 32; the electrical joint forming member 2 may be held between flat surfaces of the conductive members 31 and 32 as shown in FIG. 4.

Figure 5:
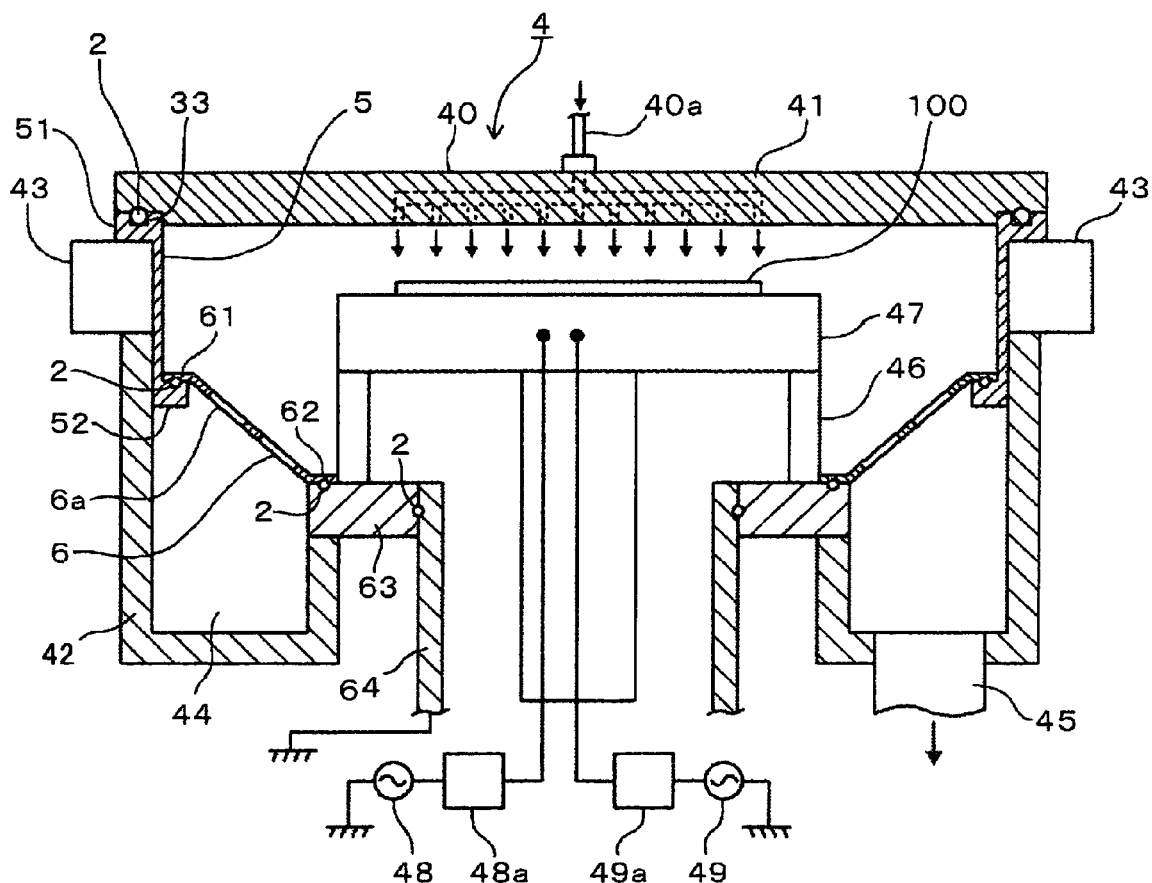
FIG. 5 is a longitudinal sectional view of a plasma processing apparatus embodying the present invention.

A plasma-assisted etching apparatus, namely a plasma processing apparatus, to which the electrical joint forming member 2 is applied, will be described with reference to FIG. 5. A process vessel 4 defining a substantially cylindrical, hermetic vacuum chamber has a top member 41, and a body 42 providing a side wall and a bottom wall of the process vessel. A loading port 43, through which a wafer 100 is loaded into the process vessel 4, is formed in a part of the body 42 near the upper end of the body 42 to project from the body 42. A cylindrical deposition shield 5 is placed in the body 42 so as to cover the inner surface of the side wall of the body 42. The deposition shield 5 is spaced from the side wall of the body 42 by, for example, a spacer, not shown. The process vessel 4 and the deposition shield 5 are conductive members formed of, for example, aluminum.

The upper brim of the deposition shield 5 is bent radially outward to form a flange 51. The flange 51 of the deposition shield 5 is held between the upper end of the body 42 and a peripheral part of the top member 41. The electrical joint forming members 2 previously described are placed between the upper surface of the flange 51 and the lower surface of the peripheral part of the top member 41. As is already described with reference to FIGS. 2 and 3, the electrical joint forming members 2 are placed in grooves 33 formed in the flange 51, and the flange 51 and the top member 41 are fastened together with not-shown bolts to ensure that the flange 51 and the top member 41 are in electric contact with each other. The electrical joint forming members 2 and the not-shown bolts are arranged at angular intervals along a circumference of the process vessel 4. The deposition shield 5 is provided with an electric heater (not shown) in order to prevent thermal loss in the process vessel 4, improve processing efficiency, suppress the deposition of reaction products on the process vessel 4, and extend the period of maintenance.

The lower brim of the deposition shield 5 is bent radially inward to form a flange 52. The lower surface of an upper flange 61 of a conical baffle 6 is joined to the upper surface of the flange 52 with the electrical joint forming members 2 held between the flanges 52 and 61. The lower surface of a lower flange 62 of the conical baffle 6 is joined to the upper surface of a support ring 63 with the electrical joint forming members 2 held between the lower flange 62 and the support ring 63. The outer circumference of an upper part of a cylindrical member 64 is joined to the inner circumference of the support ring 63 with the electrical joint forming members 2 held between the support ring 63 and the cylindrical member 64. The lower end of the cylindrical member 64 is connected to a ground. The baffle 6, the support ring 63 and the cylindrical member 64 are conductive members formed of, for example, aluminum. Parts of those conductive members forming joints including the electrical joint forming members 2 are fastened together with bolts, not shown. Thus, the top member 41, the deposition shield 5, the baffle 6, the support ring 63 and the cylindrical member 64 are maintained at a ground potential. Since the joint of the support ring 63 and the cylindrical member 64 are outside a process atmosphere, the same joint does not need necessarily to be provided with the electrical joint forming member 2 having the previously described structure, and may be provided with an electrical joint forming member in a form of a spiral of a copper-beryllium alloy.

The lower portion of the body 42 is bent to form an exhaust chamber 44, and is joined closely to the lower surface of the support ring 63. An exhaust pipe 45 is connected to the bottom wall of the body 42 so as to open into the exhaust chamber 44. The baffle 6 is provided with openings 61 to allow gases to flow from a processing space to the exhaust chamber 44 through the openings 61. A cylindrical table support member 46 of an insulating material, such as a ceramic material, is joined closely to the upper surface of the support ring 63. A substrate support table 47, which is a conductive member formed of, for example, aluminum, is arranged on the table support member 46. The support table 47 is provided with temperature regulating means, not shown, and an electrostatic chuck, not shown. Two high-frequency power sources 48 and 49 are connected through matching circuits 48a and 49a, respectively, to the support table 47. A shower head 40 is formed in a part of the top member 41 facing the support table 47. A process gas supply pipe 40a is connected to the shower head 40 to supply process gases through the shower head 40 into the processing space. Actually, the process vessel 4 includes more separate members. However, the process vessel 4 shown in FIG. 5 is simplified for the convenience of explanation.

The operation of the plasma processing apparatus will be described. A wafer 100, on which semiconductor devices are to be built, is delivered from a load-lock chamber, not shown, through the loading port 43 into the process vessel 4, and the wafer 100 is placed on the support table 47. Then, a gate valve, not shown, is closed to seal the process vessel 4 hermetically. Subsequently, the process vessel 4 is evacuated through the exhaust pipe 45, and a process gases are supplied at predetermined flow rates through the shower head 40 into the process vessel 4 to maintain the processing space in the process vessel 4 at a predetermined vacuum of, for example, several tens millitorr.

The high-frequency power source 48 applies, for example, 100 MHz high-frequency power of 1500 W to the support table 47, which serves as a lower electrode, to produce a plasma from the process gases in the space between the support table 47 and the shower head 41, which serves as an upper electrode. The wafer 100 is processed by a plasma etching process using the plasma. The high-frequency power source 49 applies, for example, 3.2 MHz bias high-frequency power of 5800 W to the support table 47 to draw ions of the plasma toward the wafer 100. A high-frequency current flows from the support table 47 through the plasma to the top member 41, and flows through the deposition shield 5, the baffle 6, the support ring 63 and the cylindrical member 64, in that order, to the ground.

Since the electrical joint forming members 2 according to the present invention are held between adjacent conductive members (41, 5, 6, 63, 64) which face the processing space of the plasma-assisted etching apparatus, the high-frequency current flows smoothly through the conductive members to the ground. Therefore, potential can be uniformly distributed on the surfaces of the conductive members.

The electrical joint forming member according to the present invention does not need necessarily to be a spiral and may be any suitable elastic structure other than a spiral. In other words, a clad strip having a two-dimensional form and consisting of a titanium layer and an aluminum layer or layers may be shaped in any suitable three-dimensional form so that the resultant electrical joint forming member behaves as a spring. An aluminum layer may be formed on only one of the surfaces of the spiral, which comes into contact with the conductive members.

The present invention is applicable not only to the parallel plate plasma processing apparatus, but also to an apparatus that produces a plasma in its process vessel by transmitting a microwave through an antenna to the process vessel and to an apparatus that produces a plasma by electron cyclotron resonance.

EXPERIMENTS

Experiments conducted to confirm the effect of the present invention will be described Fabrication of Electrical Joint Forming Member

EXAMPLE 1

An electrical joint forming member in Example 1 was fabricated by attaching aluminum strips having a thickness of 7 $\mu$m by cold pressure welding to both the surfaces, respectively, of a titanium strip having a thickness of 75 $\mu$m and a width of 2 mm to form a clad strip, and winding the clad strip in a spiral having an outside diameter of 2.4 mm and a length of 10 mm.

Comparative Example 1

An electrical joint forming member in Comparative example 1 was fabricated by winding a stainless steel (abbreviated as "SUS" in the drawings) strip having a thickness of 80 $\mu$m and a width of 2 mm in a spiral of the same dimensions as the spiral in Example 1.

Comparative Example 2

An electrical joint forming member in Comparative example 2 was fabricated by attaching aluminum strips having a thickness of 7 $\mu$m by cold pressure welding to both the surfaces, respectively, of a Zn—Cu alloy strip having a thickness of 68 $\mu$m and a width of 2 mm to form a clad strip, and winding the clad strip in a spiral of the same dimensions as the spiral in Example 1.

Comparative Example 3

An electrical joint forming member in Comparative example 3 was fabricated by attaching aluminum strips having a thickness of 7 $\mu$m by cold pressure welding to both the surfaces, respectively, of a Ti—Cu alloy strip having a thickness of 70 $\mu$m and a width of 2 mm to form a clad strip, and winding the clad strip in a spiral of the same dimensions as the spiral in Example 1.

Comparative Example 4

An electrical joint forming member in Comparative example 4 was fabricated by forming an aluminum layer having a thickness of 7 μm by a coating process onto a surface of a stainless steel strip having a thickness of 80 μm and a width of 2 mm to form a clad strip, and winding the clad strip in a spiral of the same dimensions as the spiral in Example 1.

Preliminary Tests

The Experiments were conducted in order to test the performance of the electrical joint forming member, simulating an arrangement in which the electrical joint forming member is held between the deposition shield (5) and the top member (41).

Before conducting the Experiments, preliminary tests were conducted in order to determine the contact-load distribution. As it is impossible to measure the contact load by using a real processing apparatus, the measurement of the contact load was conducted by using a pair of aluminum rings having the same dimensions as those of the connecting portions of deposition shield (5) and the top member (41), respectively.

Figure 6A:
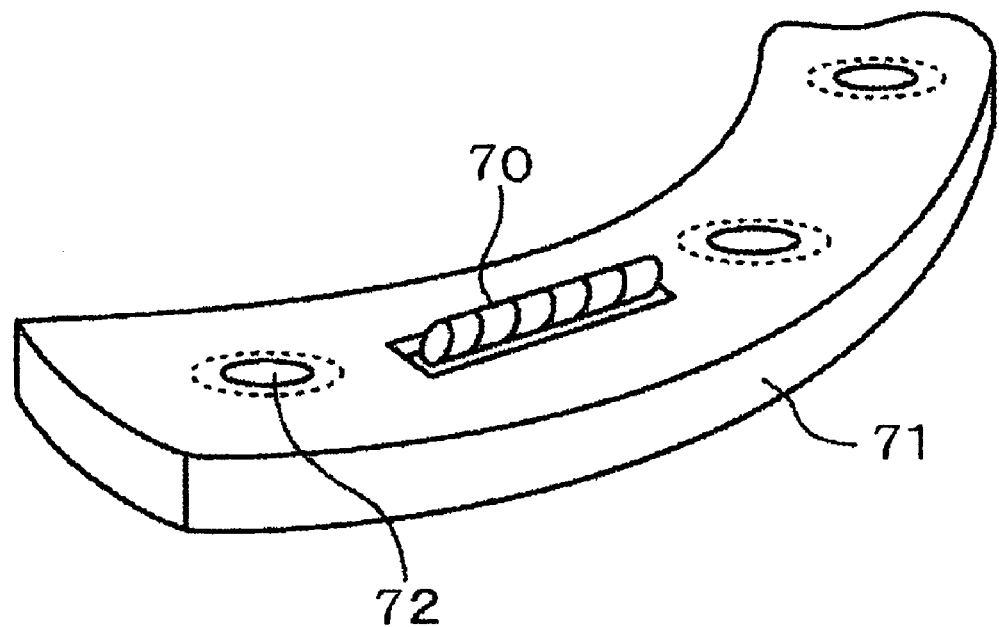
FIGS. 6A and 6B are a typical perspective view and a typical sectional view, respectively, of assistance in explaining face pressure that acts on a joining surface when conductive members are fastened together with bolts.
Figure 6B:
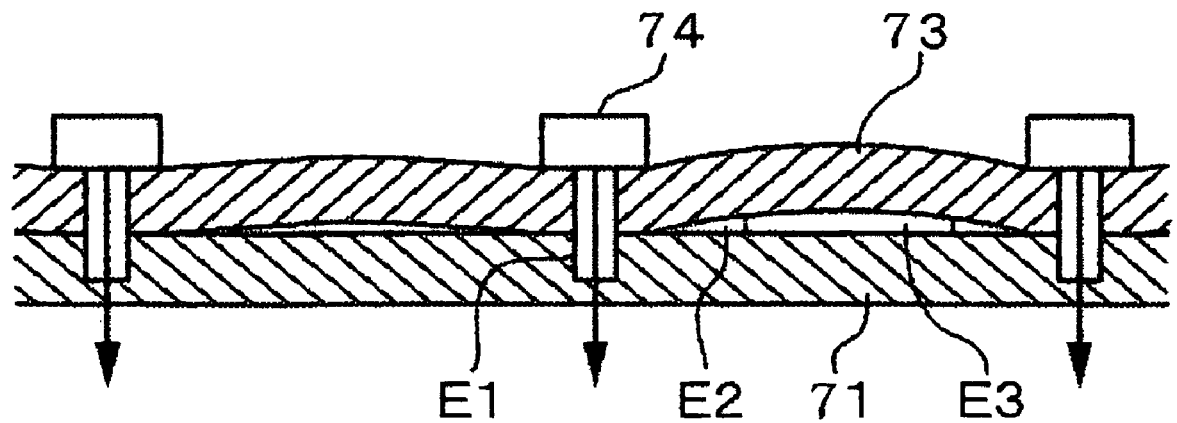

Referring to FIGS. 6A and 6B partially showing the arrangement of the test pieces for the preliminary tests, electrical joint forming members 70 are held between the aluminum rings (i.e., conductive members) 71 and 73, which are fastened by bolts 74 inserted into bolt holes 72. The aluminum rings 71 and 73 have outside diameter of 595 mm and radial width of 12 mm, and were fastened together with the eight bolts 74 arranged at equal angular intervals and fastened by a torque of 50 kgf·cm. By selectively using a push-pull gage or a load cell, contact loads acting on contact surfaces of 10 mm in length in region E1 (around the bolt 74), region E2 (remote from the bolt at 30 mm) and region E3 (where the electrical joint forming member 70 is placed) were measured.

The contact load between the members 71 and 73 at the region E1 was 50 kgf or above, the contact load between the members 71 and 73 at the region E2 was 10 kgf or below. As the contact load between the electrical joint forming member 70 and the member 71 (or 73) at the region E3 could not be directly measured, the contact load at the region E3 was estimated from a squeeze of a resin O-ring placed in the region E3. The estimated contact load on the region E3 was not lower than 3 kgf. The distance between the members 71 and 73 in FIG. 6B shows the contact-pressure distribution, in which smaller distance represents larger contact load.

Direct-current (dc) contact resistances between a pair of rectangular (10 mm×12 mm) aluminum pieces was measured while they are pressed one another at a load corresponding to the measured contact load at the region E1 (E2). Measured contact resistances corresponding to of the region E1 and E2 were in the range of 1 to 6 mΩ and 30 mΩ or above, respectively.

Squeeze Characteristics and Contact Resistance Test

The electrical joint forming member 70 was placed between a pair of aluminum pieces so that the outer circumference of the spiral contacts the aluminum pieces. The electrical joint forming member 70 was compressed by the aluminum pieces by using a loading unit. The loading unit includes a dislocation measuring device having a micrometer for measuring a squeeze of the electrical joint forming member 70 compressed by the aluminum pieces, and a push-pull gauge for measuring a compressing load (contact load) acting on the contact surfaces of electrical joint forming member 70 having a length of 10 mm and the aluminum pieces.

A dc contact resistance between the electrical joint forming member 70 and the aluminum pieces was measured by measuring a dc resistance between the aluminum pieces, and a squeeze was measured, while changing the compressing load acting on the electrical joint forming member 70. Data obtained by measurement is shown in FIGS. 7 and 8.

Figure 8:
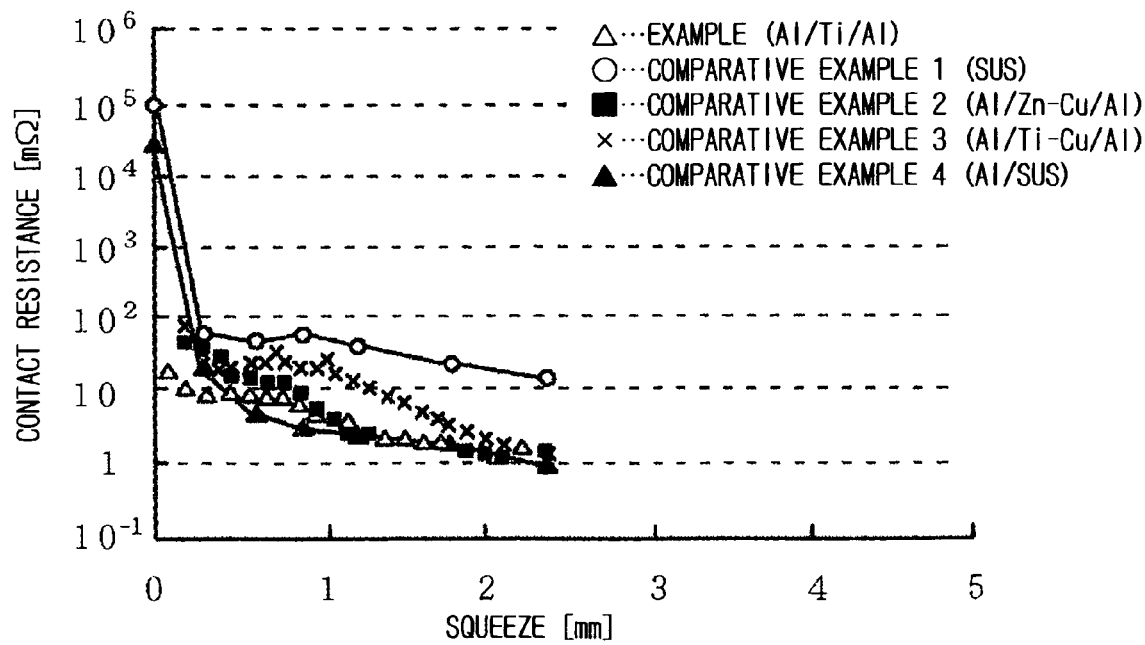
FIG. 8 is a graph showing the relation between squeeze and contact resistance for an electric joint forming member according to the present invention and a comparative electric joint forming member.

As obvious from FIG. 8 showing the relationship between the contact resistance and the squeeze, the electrical joint forming member in Comparative example 1, namely, a stainless steel spiral, showed a contact resistance in the range of 37 to 49 mΩ, when the contact pressure was in the range of 3 to 9 kgf. The contact resistance was considerably higher than that measured at region E1. It was found that the stainless steel spiral, namely, the conventional electrical joint forming member, could not satisfactorily reduce the resistance between the conductive members between which the electrical joint forming member is held.

Figure 7:
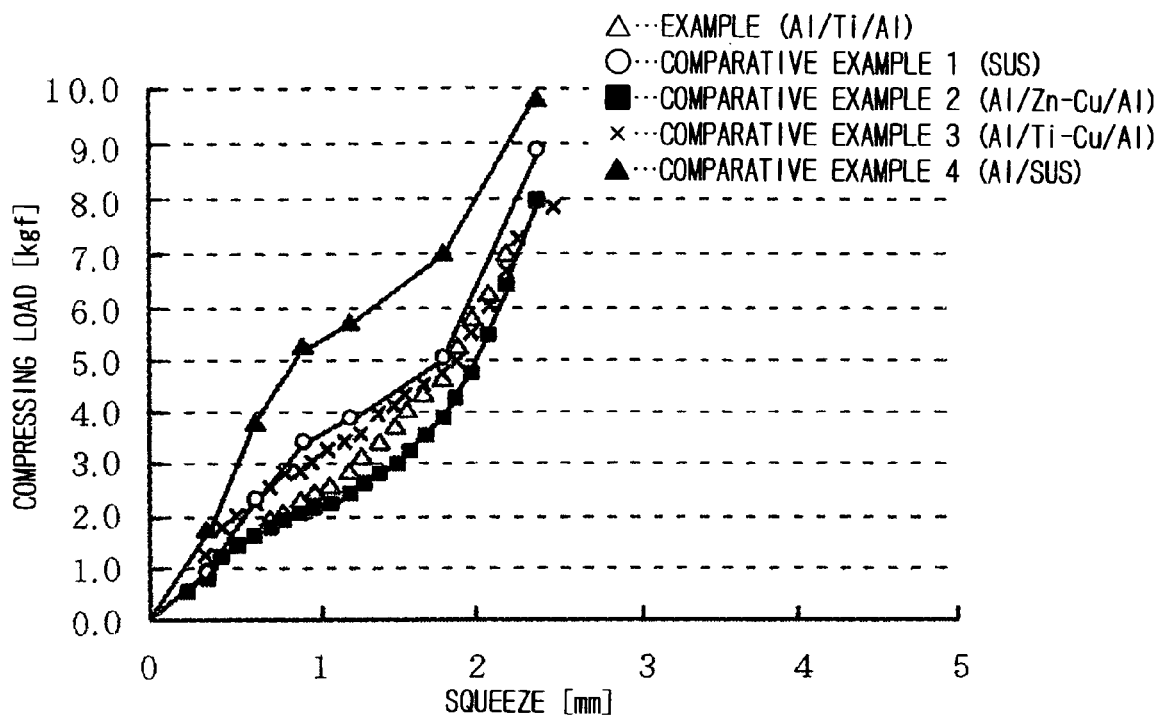
FIG. 7 is a graph showing the relation between compressing load and squeeze for an electric joint forming member according to the present invention and an electric joint forming member in a comparative example.

As obvious from FIG. 7 showing the relationship between the compressing load and the squeeze, when the electrical joint forming members are loaded equally, a squeeze in the electrical joint forming member in Comparative example 4 is the smallest, and a squeeze in the test electrical joint forming member in Comparative example 1 is the second smallest; that is, the elastic deformation resistance is improved by providing the aluminum layer on the stainless steel spiral. Squeezes in the electrical joint forming member in Example 1 fabricated from the clad strip formed by attaching the aluminum strips to both the surfaces of the titanium strip, the electrical joint forming member in Comparative example 2 fabricated by winding the clad strip formed by attaching the aluminum strips to both the surfaces of the Zn—Cu alloy strip, and the electrical joint forming member in Comparative example 3 fabricated by winding the clad strip formed by attaching the aluminum strips to both the surfaces of the Ti—Cu alloy strip are greater than that in the electrical joint forming member in Comparative Example 1 fabricated by winding the stainless steel strip in a spiral.

As obvious from FIG. 8, the contact resistances decrease with the increase of squeeze in the squeeze range of 0.6 to 2.4 mm. When squeeze is fixed at 0.6 mm, the contact resistance of the electrical joint forming member in Comparative example 1 (blank circle in FIG. 8) is the largest, and the contact resistance of the electrical joint forming member in Comparative example 3 (cross in FIG. 8) is the second largest. Contact resistances of the electrical joint forming member in Example 1 (blank triangle in FIG. 8) and Comparative examples 2 and 4 (solid square and solid triangle in FIG. 8) are considerably small.

Figure 9:
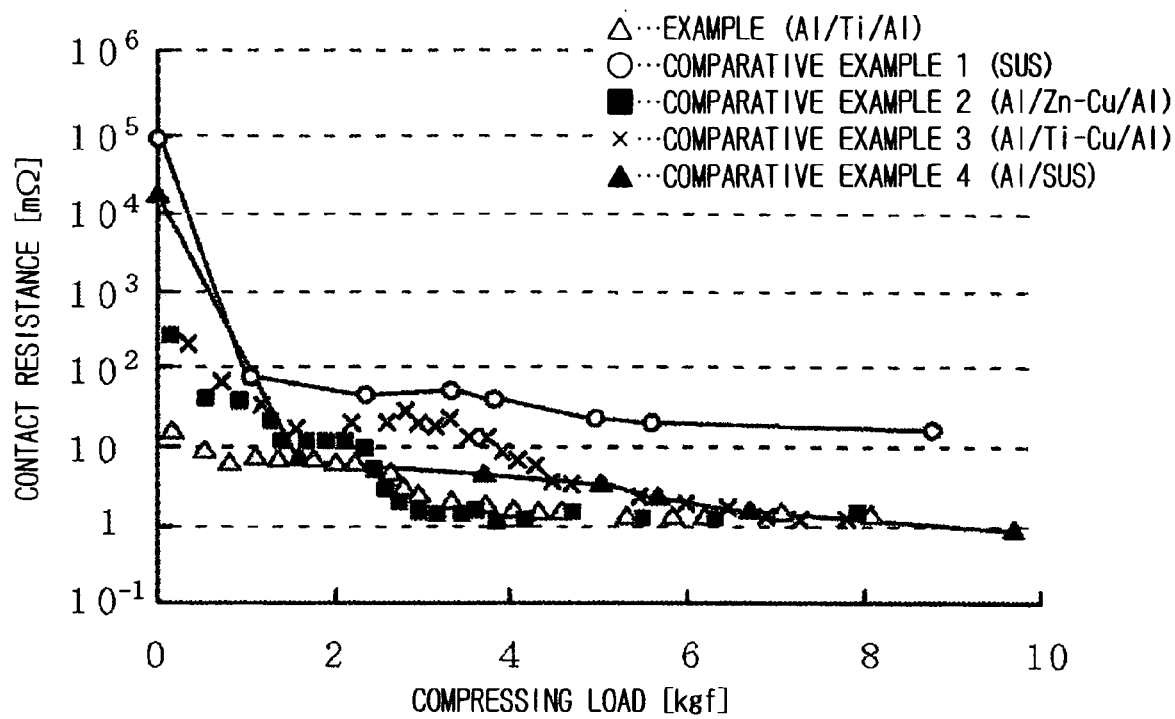
FIG. 9 is a graph showing the relation between compressing load and contact resistance for an electric joint forming member according to the present invention and comparative electric joint forming members.

FIG. 9 is a graph showing the relationship between the compressing load and the contact resistance obtained on the basis of data shown in FIGS. 7 and 8. As obvious from FIG. 9, contact resistances of the electrical joint forming member in Example 1 and Comparative examples 2, 3 and 4, namely, the spirals provided with the aluminum layers, are smaller than that in Comparative example 1, namely, the stainless steel spiral not provided with aluminum layers. The contact resistances of the electrical joint forming member in Example 1 and Comparative examples 2 and 4 are about 1/10 of that in Comparative example 1. It is known from the data shown in FIGS. 7 to 9 that the electric joint forming members, namely, the spirals, in Example 1 and Comparative examples 2, 3 and 4 each having one or both surfaces provided with the aluminum layer are superior in contact resistance to the electric joint forming member in Comparative example 1, namely, the stainless steel spiral not provided with aluminum layers.

Deformation Test

Each of the electrical joint forming members in Example 1 and Comparative examples 1 to 4 having an outside diameter of 2.4 mm was compressed by a squeeze of 0.6 mm for 2 s by using the loading device used in the squeeze characteristics and contact resistance test. After repeating applying and removing the compressing load twenty times, the outside diameter of each electrical joint forming member was measured.

Figure 10:
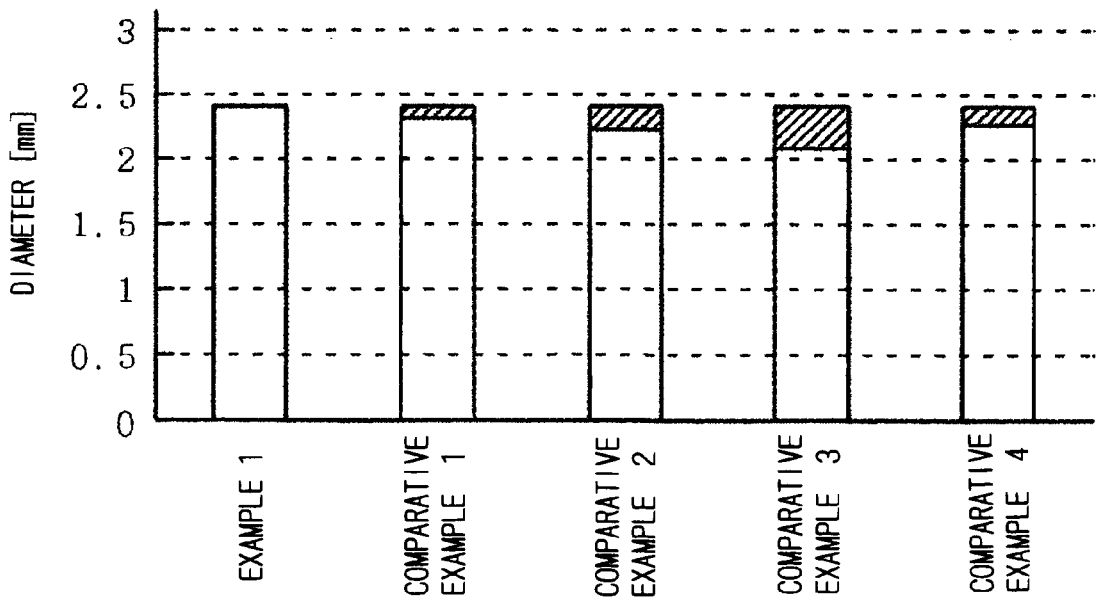
FIG. 10 is a diagram showing measured data representing the result of endurance tests of an electrical joint forming member according to the present invention and electrical joint forming members in comparative examples.

Measured outside diameters are shown in FIG. 10, in which shaded parts indicate changes in the outside diameters. It is known from FIG. 10 that the outside diameters of the electrical joint forming members in Comparative examples 1 to 4 are decreased by the repetition of compression, and the outside diameter of the electrical joint forming member in Example 1 is not changed and the electrical joint forming member in Example 1 is not permanently deformed by the repetition of compression. It is understood from the test results that the electrical joint forming member in Example 1 is most durable (has high deform resistance), when used repeatedly, among the electrical joint forming members in Example 1 and Comparative examples 1 to 4 each provided with the aluminum layer(s) on one or both surfaces of the spiral and having a low contact resistance.

Conduction Test

Figure 11:
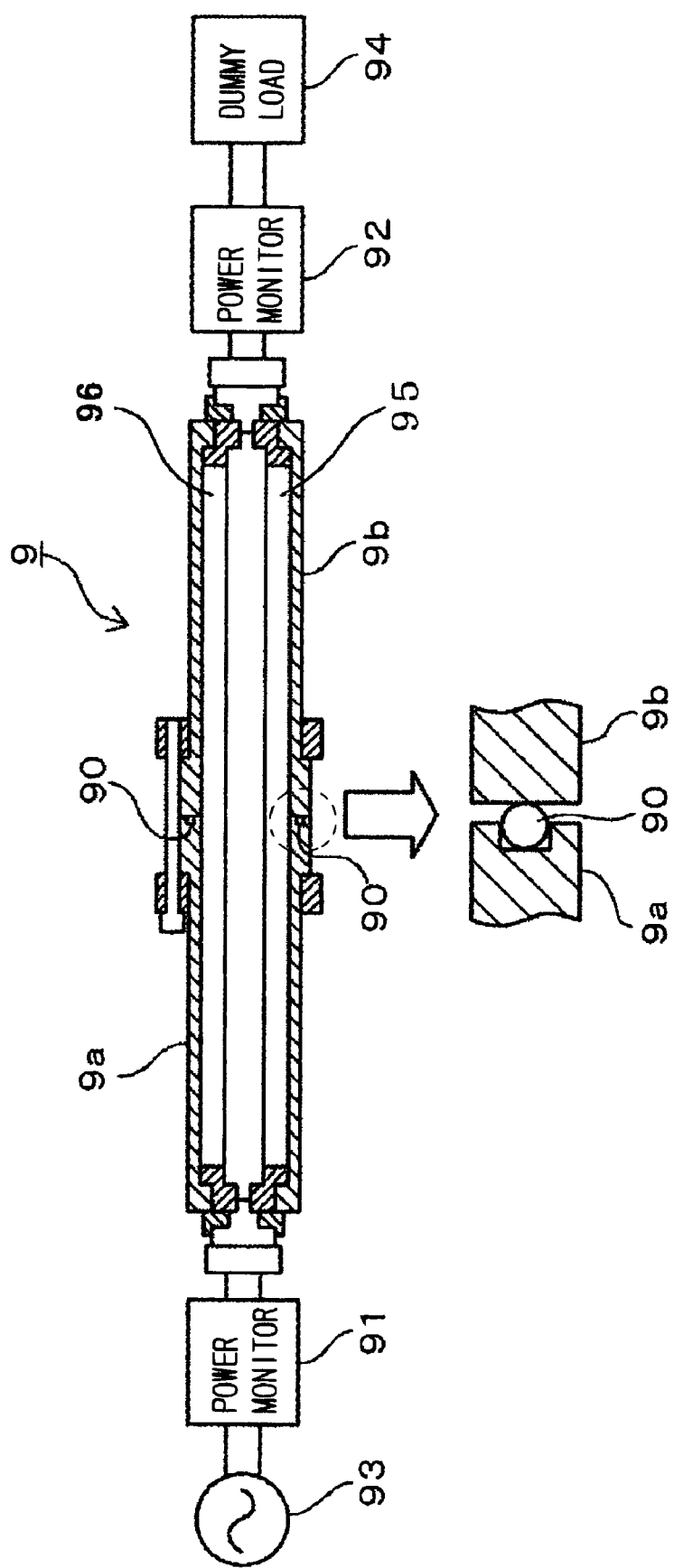
FIG. 11 is a sectional view of a measuring instrument used for studying heat generation by high-frequency power.

An electric path including the electrical joint forming member and a conductive member was formed, a high-frequency current was passed through the electric path and an increase in the temperature of the electric path was measured. Contact resistance between the electrical joint forming member and the conductive member was evaluated. A testing device shown in FIG. 11 was used. Shown in FIG. 11 are a test pipe 9, namely, a conductive member, divided into two parts 9a and 9b, an input power monitor 91 connected to one of the opposite ends of the pipe 9, an output power monitor 92 connected to the other end of the test pipe 9, a high-frequency power supply 93 connected to the input power monitor 91, a dummy load 94 connected to the output power monitor 92, an electrical joint forming member 90 held between the two parts 9a and 9b of the test pipe 9, and coaxial lines 95 and 96 having a characteristic impedance of 50 Ω. The two parts 9a and 9b of the test pipe 9 are electrically connected only by the electrical joint forming member 90.

Figure 12:
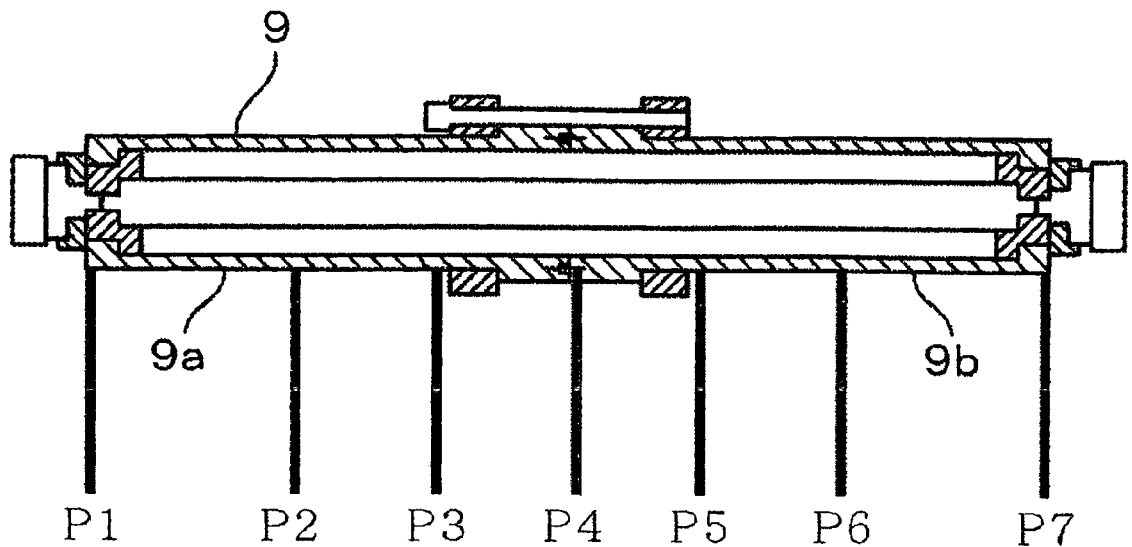
FIG. 12 is a sectional view indicating positions of temperature measurement using the measuring instrument shown in FIG. 11.

High-frequency power was applied for 80 min to the test pipe 9 of the testing device and the surface temperatures at measurement points P1 to P7 (FIG. 12) on the test pipe 9 were measured by a thermocouple. The electrical joint forming members in Example 1 and Comparative examples 1 to 4 were tested. Two electrical joint forming members 90 of 30 mm in length were disposed diametrically opposite to each other.

Figure 13:
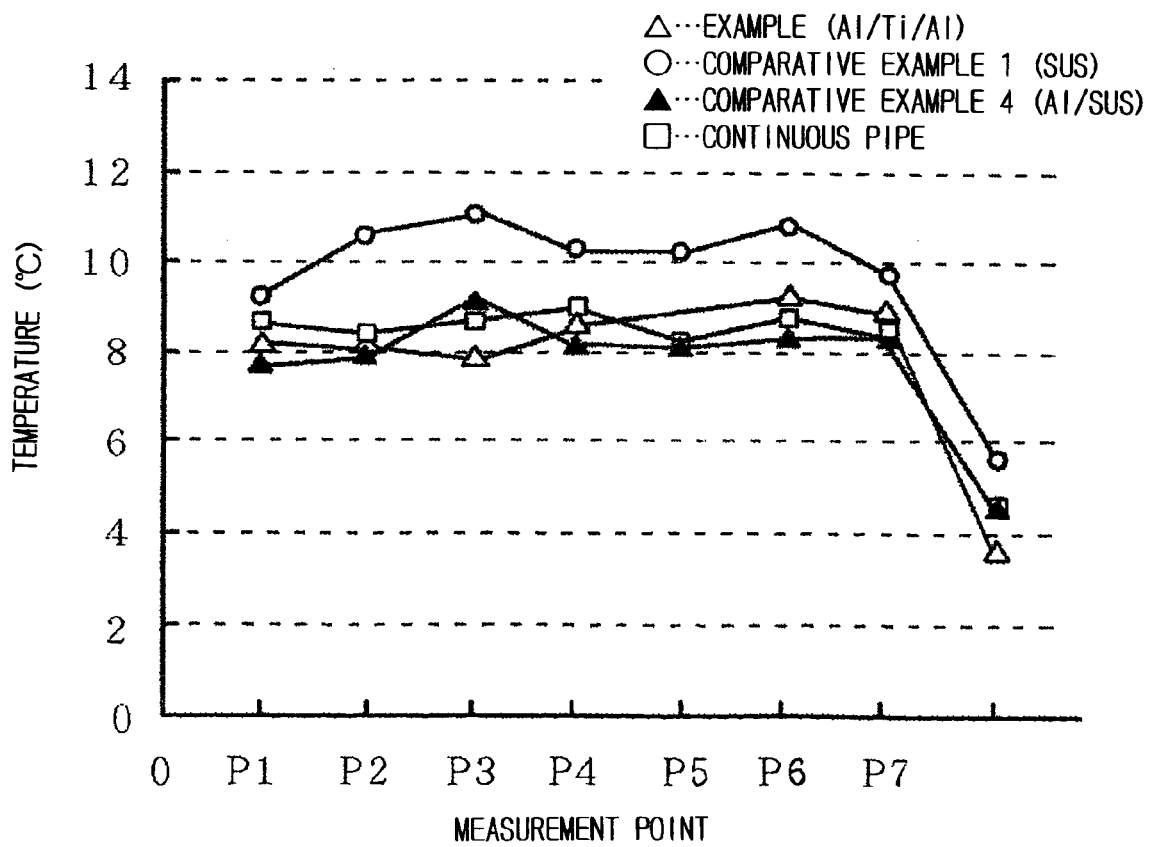
FIG. 13 is a graph showing temperatures of conductive parts measured by the measuring instrument shown in FIG. 11 when high-frequency power is supplied to the conductive parts.
Figure 15:
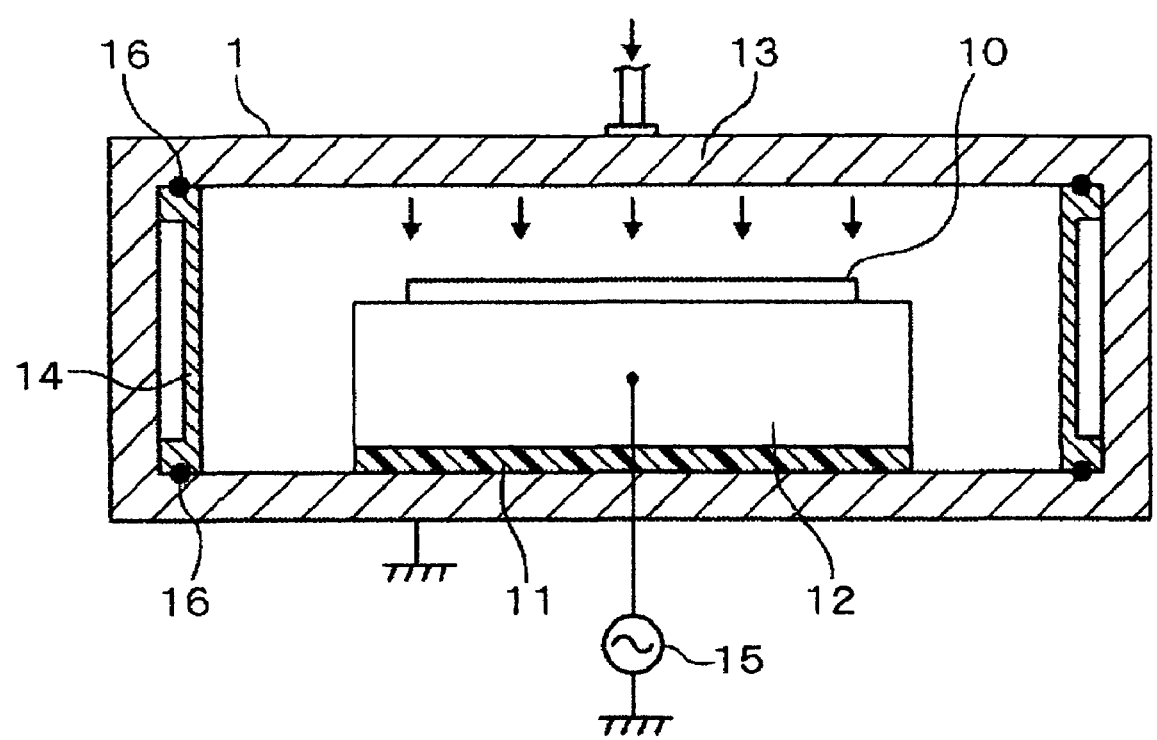
FIG. 15 is a schematic sectional view of a plasma processing apparatus employing a conventional electrical joint forming member.

FIG. 13 shows test results obtained by tests using a 100 MHz, 2 kW high-frequency power supply, and FIG. 14 shows test results obtained by tests using a 3.2 MHz, 5 kW high-frequency power supply as the high-frequency power supply 90. Each of the vertical axis of the graphs in FIGS. 13 and 14 indicates the rise in temperature at each measurement points (the difference between the measured temperature at each measurement point and an atmospheric temperature). A continuous test pipe not provided with any electrical joint forming member was subjected to the same conduction test. Measured data on this continuous test pipe is indicated by curves with blank squares in FIGS. 13 and 14.

High-frequency power was supplied by the 100 MHz, 2 kW high-frequency power supply and temperatures at the measurement points P1 to P7 on the test pipes 9 were measured. Temperatures at the measurement points P1 to P7 on the test pipe 9 provided with the stainless steel spiral in Comparative example 1 stabilized after increasing by temperature increments in the range of 9 to 11° C., and temperatures at the measurement points P1 to P7 on the test pipes 9 respectively provided with the spirals in Example 1 and Comparative example 4 provided with the aluminum layers stabilized after increasing by temperature increments in the range of 8 to 9° C. It is known from FIG. 13 that temperatures at the measurement points P1 to P7 on the test pipes 9 provided with the spirals in Example 1 and Comparative example 4 are lower than those on the test pipe 9 provided with the stainless steel spiral in Comparative example 1 by about 2° C.

High-frequency power was supplied by the 3.2 MHz, 5 kW high-frequency power supply and temperatures at the measurement points P1 to P7 on the test pipes 9. were measured. Temperatures at the measurement points P1 to P7 on the test pipe 9 provided with the stainless steel spiral in Comparative example 1 stabilized after increasing by temperature increments in the range of 8 to 10° C., and temperatures at the measurement points P1 to P7 on the test pipes 9 respectively provided with the spirals in Example 1 and Comparative examples 2 to 4 provided with the aluminum layers stabilized after increasing by temperature increments in the range of 4 to 6° C. It is known from FIG. 14 that temperatures at the measurement points P1 to P7 on the test pipes 9 provided with the spirals in Example 1 and Comparative examples 2 to 4 are lower than those on the test pipe 9 provided with the stainless steel spiral in Comparative example 1 by temperatures in the range of about 4 to about 5° C.

The tests proved that the aluminum layers coating the spirals are effective in reducing high-frequency power loss, and temperatures of parts of the pipe consisting of the two parts and the electrical joint forming member having the aluminum layers and held between the two parts are on substantially the same level as those of parts of the continuous test pipe not provided with any electrical joint forming member. Actually, temperatures of parts of the continuous test pipe were slightly higher than those of parts of the pipes each consisting of the two parts and respectively holding the electrical joint forming members in Example 1 and Comparative example 2 to 4. Those tests proved that coating the outer and the inner surface of the spiral with the aluminum layers is very effective in reducing high-frequency power loss.

It should be noted that, although the processing apparatus provided with the electrical joint forming member according to the present invention is such that it performs a plasma process for a semiconductor wafer in the foregoing embodiment, the processing apparatus may be such that it performs a plasma process for a glass substrate for a liquid crystal display, or may be a MEMS (Micro Electro Mechanical System) fabricating apparatus that performs a plasma process.

What is claimed is:

1. An electrical joint forming member to be held between adjacent conductive members included in a semiconductor device fabricating apparatus to reduce electrical resistance between those conductive members, said electrical joint forming member comprising:

an elastic member made of a titanium sheet and having a surface covered with an aluminum layer, the aluminum layer being formed by joining an aluminum sheet to the surface of the titanium sheet by cold-roll bonding.

2. The electrical joint forming member according to claim 1, wherein the elastic member is a spiral.

3. The electrical joint forming member according to claim 1, wherein the aluminum layer has a thickness of 50 μm or below.

4. The electrical joint forming member according to claim 1, wherein high-frequency current flows through the conductive members electrically connected by the electrical joint forming member.

5. A plasma processing apparatus for processing a surface of a substrate by a predetermined process using a plasma produced by discharging a process gas by high-frequency power, said plasma processing apparatus comprising:

electrically conductive members assembled to constitute a part of said plasma processing apparatus; and the electrical joint forming member as defined in claim 1 held between adjacent conductive members.

* * * * *